United States Patent
Wang et al.

(10) Patent No.: US 6,890,860 B1
(45) Date of Patent: May 10, 2005

(54) METHOD FOR ETCHING AND/OR PATTERNING A SILICON-CONTAINING LAYER

(75) Inventors: Tinghao F. Wang, Fremont, CA (US); Usha Raghuram, San Jose, CA (US); James E. Nulty, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 641 days.

(21) Appl. No.: 09/345,173

(22) Filed: Jun. 30, 1999

(51) Int. Cl.[7] .................. H01L 21/302; H01L 21/461
(52) U.S. Cl. .................. 438/706; 438/716; 438/719; 438/723; 438/745; 438/753; 438/756; 134/1.1; 134/1.2; 134/1.3
(58) Field of Search .................. 438/719, 723, 438/706, 745, 753, 756, 714, 729, 734, 738, 743; 134/1.1, 1.2, 1.3

(56) References Cited

U.S. PATENT DOCUMENTS

| | | | |
|---|---|---|---|
| 4,460,435 A | * 7/1984 | Maa .................. 156/643 |
| 4,502,915 A | * 3/1985 | Carter et al. .................. 156/643 |
| 4,702,000 A | 10/1987 | Matlock et al. |
| 5,242,536 A | * 9/1993 | Schoenborn .................. 156/643 |
| 5,308,400 A | * 5/1994 | Chen .................. 134/2 |
| 5,342,801 A | 8/1994 | Perry et al. |
| 5,346,585 A | 9/1994 | Doan et al. |
| 5,378,648 A | 1/1995 | Lin et al. |
| 5,449,433 A | 9/1995 | Donohoe |
| 5,453,156 A | * 9/1995 | Cher et al. .................. 156/643.1 |
| 5,631,178 A | * 5/1997 | Vogel et al. .................. 438/719 |
| 5,639,681 A | 6/1997 | Carmody et al. |
| 5,656,533 A | 8/1997 | Kim |
| 5,674,354 A | 10/1997 | Su et al. |
| 5,705,419 A | 1/1998 | Perry et al. |
| 5,792,708 A | 8/1998 | Zhou et al. |
| 5,811,022 A | * 9/1998 | Savas et al. .................. 216/68 |
| 5,930,650 A | * 7/1999 | Chung et al. .................. 438/753 |

OTHER PUBLICATIONS

Wolf et al., Silicon Processing for the VLSI Era, 1986, vol. 1, p. 429, 446.*

* cited by examiner

*Primary Examiner*—Duy-Vu Deo
(74) *Attorney, Agent, or Firm*—Evan Law Group LLC

(57) ABSTRACT

Prior to etching a poly-II layer during fabrication of an integrated circuit, a hydrofluoric acid (HF) dip is used to remove surface oxides from the poly-silicon layer and an anisotropic descumming operation is used to remove any resist material left over from a patterning operation. Following patterning, a long breakthrough etch (e.g., sufficient to remove 300–1500 Å of oxide) using an anisotropic breakthrough etchant (e.g., a fluorocarbon-based etchant) is performed before the poly-silicon layer is etched. The HF dip may be repeated if a predetermined time between the first dip and the etch is exceeded. The anisotropic descumming operation may be performed using an anisotropic anti-reflective coating (ARC) etch, e.g., a $Cl_2/O_2$, $HBr/O_2$, $CF_4/O_2$ or another etch having an etch rate of approximately 3000 Å/min for approximately 10–20 seconds. The poly-silicon layer may be annealed following (but not prior to) the etch thereof.

20 Claims, 2 Drawing Sheets

__US 6,890,860 B1__

METHOD FOR ETCHING AND/OR PATTERNING A SILICON-CONTAINING LAYER

FIELD OF THE INVENTION

The present invention relates to the field of semiconductor device manufacturing processes and, in particular, to a stringer-free, second poly-silicon layer patterning process.

BACKGROUND

During the manufacture of integrated circuits (ICs) containing more than one layer of poly-silicon (or poly-silicon features created from poly-silicon layers deposited at different times), it is not uncommon to encounter the formation of stringers. Stringers can be broadly defined as residual materials left over from an etch process. Such stringers can present problems when they are composed of conductive materials (e.g., poly-silicon), because they can provide conductive paths between adjacent features, resulting in short circuits.

In the past, IC manufacturers have sought to remove poly-silicon stringers using isotropic etchants such as $NF_3$ and $SF_6$. Such techniques may be useful for ICs that have critical dimensions of above approximately 0.35 microns, however, as these critical dimensions shrink (e.g., to on the order of less than 0.35 microns and smaller), the use of isotropic etchants must be avoided so as not to undercut useful device features (e.g., gate structures and the like). As a result, others have attempted to remove stringers by adding dielectric spacer layers or even changing the shape of underlying structures (e.g., so as to provide a more uniform etch surface). These solutions involve complex manufacturing processes that deviate from the goal of simplifying the manufacture of ICs whenever possible. Still others have suggested that dummy features could be introduced on areas of a semiconductor die to create diversionary paths for the short circuits that might result from the presence of stringers. The problem with this solution is that it tends to waste valuable die space.

Accordingly, it would be useful to have a procedure for producing stringer-free poly-silicon layers that avoids the drawbacks of prior solutions.

SUMMARY OF THE INVENTION

In one embodiment, prior to etching an upper poly-silicon layer (e.g., one formed over an existing poly-silicon structure) during fabrication of an integrated circuit, a hydrofluoric acid (HF) dip is used to remove surface oxides from the poly-silicon layer; an anisotropic descumming operation is used to remove any resist material left over from a patterning operation; and, a long breakthrough etch using an anisotropic breakthrough etchant is performed, all before the poly-silicon layer is etched. Following the poly etch, a conventional anneal may be performed, however, this anneal should not occur prior to the poly etch.

The HF dip may be repeated if a predetermined time (e.g., 24 to 48 hours, but preferably more than 12 hours) between the first dip and the etch is exceeded. Also, a second HF dip may be performed if a subsequent photoresist re-patterning operation is needed.

The anisotropic descumming operation may be performed using any anisotropic anti-reflective coating (ARC) etch, for example a $Cl_2/O_2$, $HBr/O_2$ or $CF_4/O_2$ etch, or any such etch having an etch rate of approximately 3000 Å/min for approximately 10–20 seconds.

The anisotropic breakthrough etch may be a fluorocarbon-based etchant, or another oxide removing etchant. Whereas conventional breakthrough etch periods are usually performed for a time sufficient to remove approximately 100 Å of oxide, the present breakthrough etch period may be on the order of sufficient time to remove 300–1500 Å of oxide from a relatively flat poly-silicon surface, e.g., approximately 25–45 seconds, depending on the thickness of the oxide.

BRIEF DESCRIPTION OF THE DRAWINGS

The present invention is illustrated by way of example, and not limitation, in the accompanying figures, in which.

DETAILED DESCRIPTION

A stringer-free, second poly-silicon layer patterning process is disclosed herein. Although discussed with reference to certain illustrated embodiments, upon review of this specification, those of ordinary skill in the art will recognize that the present methods may find application in a variety of systems. Therefore, in the following description the illustrated embodiments should be regarded as exemplary only and should not be deemed to be limiting in scope.

Figure 1:
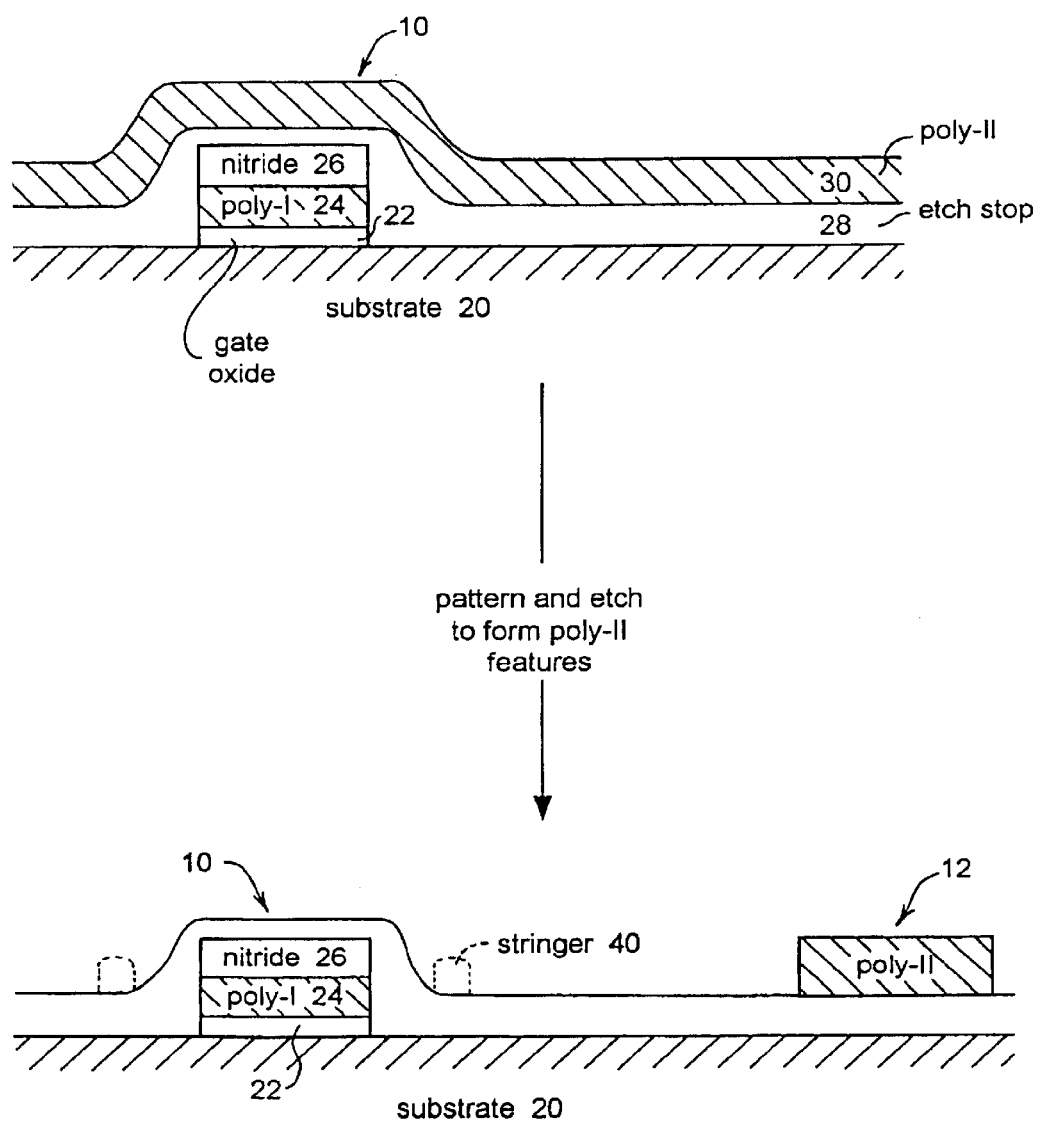
FIG. 1 illustrates examples of integrated circuit cross-sections that may be produced during patterning of a poly-II layer in accordance with the present methods.

To better appreciate the present methods, refer first to FIG. 1. Illustrated therein is a first poly-silicon feature 10, formed over a substrate 20. The first poly-silicon feature 10 may be a gate structure for a transistor (e.g., of a memory cell) or some other feature. The feature 10 may be formed by any conventional process, such as growing a gate oxide layer 22 over the substrate 20, depositing a poly-I layer 24 (i.e., a first poly-silicon layer) thereover, and forming a nitride cap 26 on top of the poly-I layer. Subsequent patterning (e.g., using a conventional photoresist deposition and exposure process) and etching (e.g., using conventional etchants) steps can be used to form the final poly-silicon feature 10.

Now, in preparation for forming a second poly-silicon feature 12, an etch stop layer 28 is blanket deposited and a second poly-silicon layer (poly-II) 30 is deposited thereover. As noted above, if conventional techniques were used to pattern and etch the poly-II layer 30 to form the second poly-silicon feature 12, one could expect to find stringers 40 (shown in dotted outline in the illustration) left in the vicinity of the first poly-silicon feature 10. In this instance, such stringers 40 may be formed due to the relative thickness of the poly-II layer deposited in the vicinity of the first poly-silicon feature 10. In other situations (e.g., in the formation of features with retrograde or re-entrant profiles), stringers may be formed due to overhanging topographies, etc.

Figure 2:
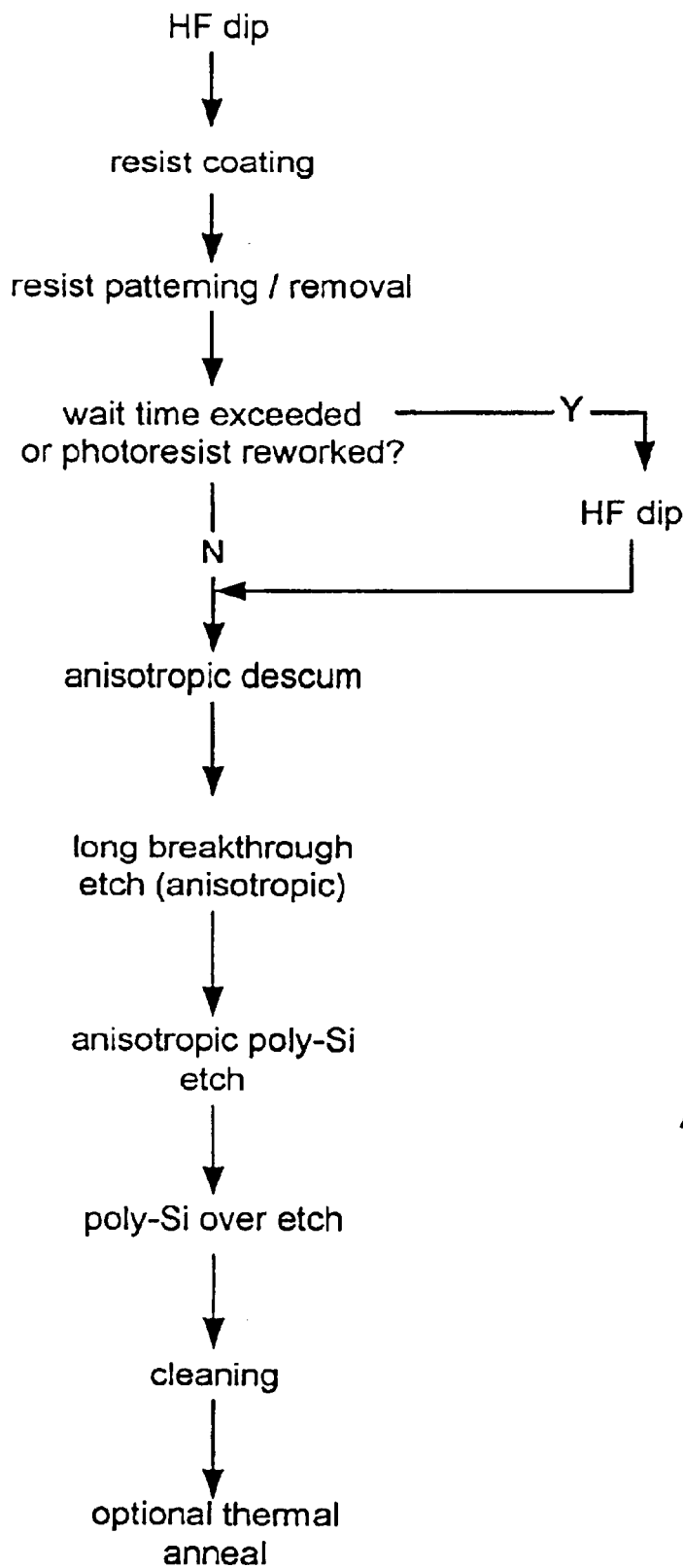
FIG. 2 illustrates various steps during the fabrication of an integrated circuit in accordance with an embodiment of the present method.

In order to maintain the relatively small critical dimension of features 12, isotropic etchants should not be used to remove the stringers 40 (even though such etchants may remove the stringers). Accordingly, the present method adopts a process wherein only anisotropic etchants are used. An anisotropic etchant is one that removes material in a direction perpendicular to that defined by the substrate 20. The complete process can be further discussed with reference to FIG. 2.

According to the present methods, prior to beginning formation of the poly-II feature, that is, after depositing the poly-II layer but before commencing the patterning thereof, the wafer or die is subjected to an HF (hydrofluoric acid) dip. The HF dip is used to remove surface oxides that may have accumulated on the wafer (e.g., due to the use of sulfuric acid and/or hydrogen peroxide in prior process steps). It has been found that the presence of these surface oxides may contribute to the formation of stringers. The HF dip is carried out for a brief period of time (e.g., on the order of a few seconds, for example 10 sec. to one min., and preferably approximately 30 sec.), in HF having a conventional (dilute) concentration (e.g., 50:1). Of course, other HF concentrations that provide similar oxide removal characteristics (e.g., allowing for removal of approximately 30–100 Å of oxide) within given time parameters may be used.

Following the HF dip, the photoresist coating may be applied and patterned for the poly-II features in the conventional fashion. Following the patterning, this photoresist layer is removed (again by conventional processes). In some cases, it is necessary to repeat the patterning process. In such cases, the HF dip should be repeated to remove any oxides that may have accumulated. Also, if after the photoresist layer has been removed the wafer is exposed to air for any appreciable time period (e.g., a minute or more), another HF dip should be performed to remove any oxide build up on the poly-II layer that is now exposed. Also, no more than 24–48 hours (and preferably less than 12 hours) should elapse between the original HF dip and the etching of the poly-II layer. If this "queue time" is exceeded, another HF dip should be performed.

Next, an anisotropic descumming process is performed. Scumming refers to residual resist material that is left behind in areas that should have been cleaned out during the photoresist developing operation. The anisotropic descumming operation removes these materials. Any conventional anisotropic descumming chemistry may be used in this procedure, or an anisotropic anti-reflective coating (ARC) etch may be used. For example, a $Cl_2/O_2$, $HBr/O_2$ or $CF_4/O_2$ etch, or any other conventional ARC etch) having an etch rate of approximately 3000 Å/min may be used for approximately 10–20 sec. (or other chemistries for appropriate times) to remove 500–1500 Å of resist material.

Following the descumming process, a long breakthrough etch is performed. This etch may use any anisotropic breakthrough etchant, such as a fluorocarbon-based etchant (e.g., $CF_4$, $C_2F_6$ or $CHF_3$), or any other oxide removing etchant. The etch period should be long enough to remove any in-situ vertical sidewall oxides that may have formed, for example on the order of sufficient time to remove 300–1500 Å of oxide from a relatively flat poly-silicon surface (e.g., approximately 25–45 sec.).

Next, the conventional anisotropic etch of the poly-II layer, followed by a poly-II over etch may be performed. Each of these steps are conventional processing steps and need not be described further. Finally, an optional rapid thermal anneal (e.g., after a cleaning step) may be performed if so desired. Typically, such an anneal has been performed after an implant step, following deposition of the poly-II layer. However, here the anneal is being done after the poly-II patterning and etch steps, because a prior anneal may affect the oxide growth on the poly-II and contribute to the formation of stringers. Thus, the use of an anneal following the poly-II etch to aid in stringer reduction is another new feature of the present method. The anneal itself may be conventional in nature (e.g., at temperatures of approximately 900°–1000° C. for 20–30 sec.).

Thus a stringer-free, second poly-silicon layer patterning process has been described. The above process may be applied to any second poly-silicon layer patterning process during the fabrication of integrated circuits. Therefore, although the foregoing description and accompanying figures discuss and illustrate specific embodiments, it should be appreciated that the present invention is to be measured only in terms of the claims that follow.

What is claimed is:

1. A method comprising etching a poly-silicon layer during fabrication of an integrated circuit following a first hydrofluoric acid (HF) dip to remove surface oxides from the poly-silicon layer, an anisotropic descumming operation to remove resist material left over from a patterning operation on the poly-silicon layer and a long anisotropic breakthrough etch.

2. The method of claim 1 wherein a second HF dip is performed.

3. The method of claim 2 wherein approximately 24–48 hours are exceeded between the first hydrofluoric acid dip and the etch.

4. The method of claim 2 wherein approximately 12 hours are exceeded between the first hydrofluoric acid dip and the etch.

5. The method of claim 1 wherein a second HF dip is performed if a subsequent photoresist patterning operation is needed.

6. The method of claim 1 wherein the breakthrough etch is performed using a fluorocarbon-based etchant.

7. The method of claim 6 wherein the breakthrough etch is performed for a time period sufficient to remove approximately 300–1500 Å of oxide.

8. The method of claim 6 wherein the descumming operation is performed using a chlorine-based etchant, a bromine-based etchant or a fluorine-based etchant.

9. The method of claim 1 wherein the breakthrough is performed using an oxide removing etchant.

10. The method of claim 9 wherein the breakthrough etch is performed for sufficient time to remove 300–1500 Å of oxide from a relatively flat poly-silicon surface.

11. The method of claim 9 wherein the breakthrough etch is performed for approximately 25–45 seconds.

12. The method of claim 9 further comprising annealing the poly-silicon layer after the poly-silicon layer has been etched.

13. The method of claim 1 wherein the anisotropic descumming operation is performed using an anisotropic anti-reflective coating (ARC) etch.

14. The method of claim 1 wherein anisotropic descumming operation is performed using an etch chosen from the group consisting of $Cl_2/O_2$, $HBr/O_2$, $CF_4/O_2$ having an etch rate of approximately 3000 Å/min for approximately 10–20 seconds.

15. The method of claim 1 wherein the poly-silicon layer is deposited over an existing poly-silicon feature on the integrated circuit.

16. The method of claim 1 wherein the poly-silicon layer is other than an initial poly-silicon layer deposited during the formation of the integrated circuit.

17. A method for making a semiconductor structure, comprising:

dipping a substrate in hydrofluoric acid;
patterning a photoresist layer on the substrate;
descumming the substrate with an anisotropic descumming operation; and
breakthrough etching the substrate;
wherein the substrate comprises
(i) a semiconductor substrate,
(ii) a first poly-silicon layer on the substrate, and
(iii) a second poly-silicon layer on the substrate.

18. The method of claim 17, further comprising etching the second poly-silicon layer.

19. The method of claim 17, further comprising annealing the substrate after the etching of the second poly-silicon layer.

20. The method of claim 17, further comprising a second hydrofluoric acid dip.

* * * * *